(12) United States Patent
Chen et al.

(10) Patent No.: US 6,350,646 B1
(45) Date of Patent: Feb. 26, 2002

(54) METHOD FOR REDUCING THERMAL BUDGET IN NODE CONTACT APPLICATION

(75) Inventors: Tung-Po Chen, Taichung; Yung-Chang Lin, Feng-Yuan, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/484,786

(22) Filed: Jan. 18, 2000

(51) Int. Cl.[7] .......................................... H01L 21/8242
(52) U.S. Cl. ....................... 438/253; 438/239; 438/256; 438/396
(58) Field of Search ................................ 438/253, 239, 438/241, 250, 256, 396, 399

(56) References Cited

U.S. PATENT DOCUMENTS 6,180,538 B1 * 1/2001 Halliyal et al. ............. 438/769
6,228,711 B1 * 5/2001 Hsieh .......................... 438/255

OTHER PUBLICATIONS

C. Y. Chang et al. "ULSI Technology" 1996, pp 159, 168–169, 196–198.*

* cited by examiner

Primary Examiner—Charles Bowers
Assistant Examiner—Jack Chen

(57) ABSTRACT

A method for manufacturing a semiconductor device is disclosed. The method can reduce thermal budget in node contact application. It includes mainly the following processes. A substrate is first provided, then a dielectric layer is formed over the substrate. Next, a node contact opening through the dielectric layer to top surface of the substrate is formed by coating the dielectric layer with a photoresist layer, patterning the photoresist layer with pattern of a node contact by exposure and development, then etching the dielectric layer until top surface of said substrate exposed using said patterned photoresist layer as a mask. Subsequently, the photoresist layer is removed. Finally, a silicon nitride layer is formed on inside wall of the node contact opening by rapid thermal chemical vapor deposition (RTCVD).

11 Claims, 2 Drawing Sheets

METHOD FOR REDUCING THERMAL BUDGET IN NODE CONTACT APPLICATION

BACKGROUND OF THE INVENTION

1. Field of the Invention

The present invention relates to a method for manufacturing a semiconductor device, more particularly to node contact application in a semiconductor device.

2. Description of the Prior Art

For some data processing applications, it has become desirable to provide integrated circuit devices that incorporate on the same chip both arrays of memory cells and arrays of high speed logic circuits like those typically used in microprocessors or digital signal processors. It might, for example, be desirable to provide an array of dynamic random access memory cells within the integrated circuit device to provide dedicated, comparatively high speed access to a significant amount of data storage for the logic circuits of the integrated circuit device. Applications that could benefit from the provision of such embedded DRAM include logic circuits that process large amounts of data, such as graphics processors. Use of embedded memory might also reduce the number of pins or input/output terminals required by the integrated circuit device.

Referring to FIG. 1, the merged of logic 10 and DRAM 11 has been widely investigated due to the implemention of system on chip. After gates 14 and bit lines 12 are completed, we form an inter-poly dielectric (IPD) layer 13 by any proper process to isolate the bit lines 12 and the word lines 14 from other overhead devices to prevent the short. Then, to form node contact for lower electrode 21 of a capacitor, photolithography and etch processes are used to form a node contact opening 15 through the dielectric layer 13 to top surface of the substrate 19. Before filling the node contact opening 15 with a conductor, a thin silicon nitride (SiN) layer 20 serving as a buffer is generally formed on inside wall of the node contact opening 15. In conventional, the thin SiN layer 20 was deposited by low pressure chemical vapor deposition (LPCVD). However, the logic PMOS device and salicide stability will be degraded during the LPCVD SiN film 20 deposition. Because the LPCVD process take the time about 4 hours, and its implementing temperature is controlled in the range of about 630 to 780° C. However, the logic N/PMOS performance and salicide 16 stability are seriously degraded by the additional DRAM thermal budget. Moreover, the re-diffusion effect 17 in source/drain region 18 occurs during the deposition process for the SiN layer 20. The re-diffusion effect 17 will cause the more leakage of electrons in the source/drain region 18 and lead to the shift of threshold voltage.

For the foregoing reasons, there is a need to develop a method for manufacturing an embedded dynamic random access memory to reduce DRAM process thermal budget and to prevent the shift of threshold voltage due to the re-diffusion effect caused in source/drain region.

SUMMARY OF THE INVENTION

In accordance with the present invention, a method is provided for forming an embedded dynamic random access memory. The method substantially prevents the shift of threshold voltage and reduces the thermal budget for manufacturing E-DRAM. In one embodiment, a substrate having a logic region and a memory region is provided. Then, gate structures are formed on both the logic region and the memory region. A first inter-poly dielectric layer is formed on all surfaces, then a opening is formed, over the memory region, from top surface of the first inter-poly dielectric layer to top surface of the substrate. A conductor is formed on the first inter-poly dielectric layer and to fill the opening. Subsequently, a bit line is completed using photolithography and etching the conductor. The next step is forming a second inter-poly dielectric layer on both the first inter-poly dielectric layer and the bit line. Then a node contact opening is formed through the first inter-poly dielectric layer and the second inter-poly dielectric layer to top surface of the substrate. Finally, a silicon nitride layer is formed on inside wall of the node contact opening by rapid thermal chemical vapor deposition (RTCVD).

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The key feature of the present invention is using rapid thermal chemical vapor deposition (RTCVD) to form the silicon nitride buffer in a node contact opening during manufacture of an embedded dynamic random access memory (E-DRAM). The following description is concerning the main steps of manufacturing the E-DRAM.

Figure 1:
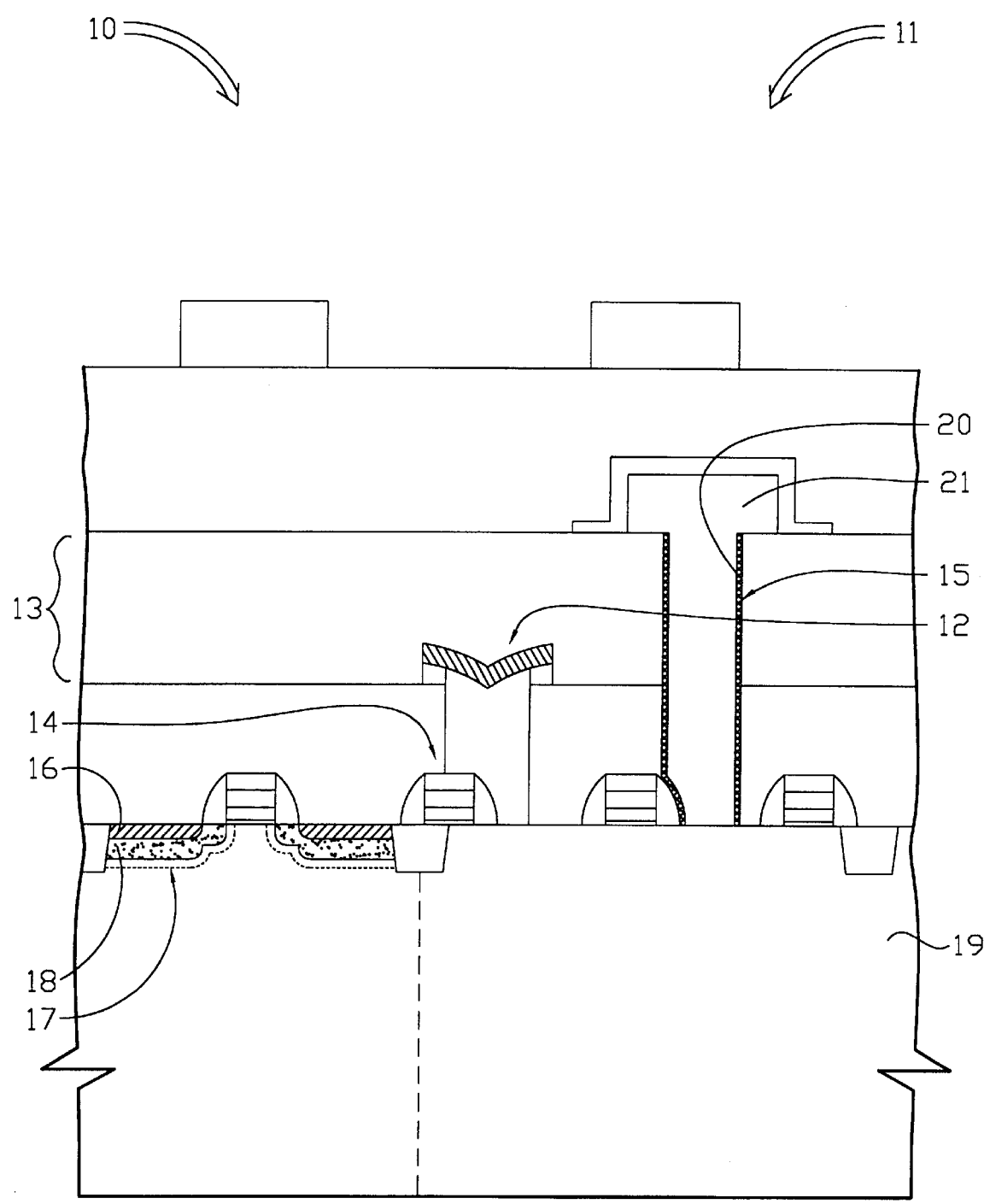
FIG. 1 shows mainly the re-diffusion effect in source/drain region of an E-DRAM after forming the silicon nitride buffer in node contact by conventional LPCVD.
Figure 2:
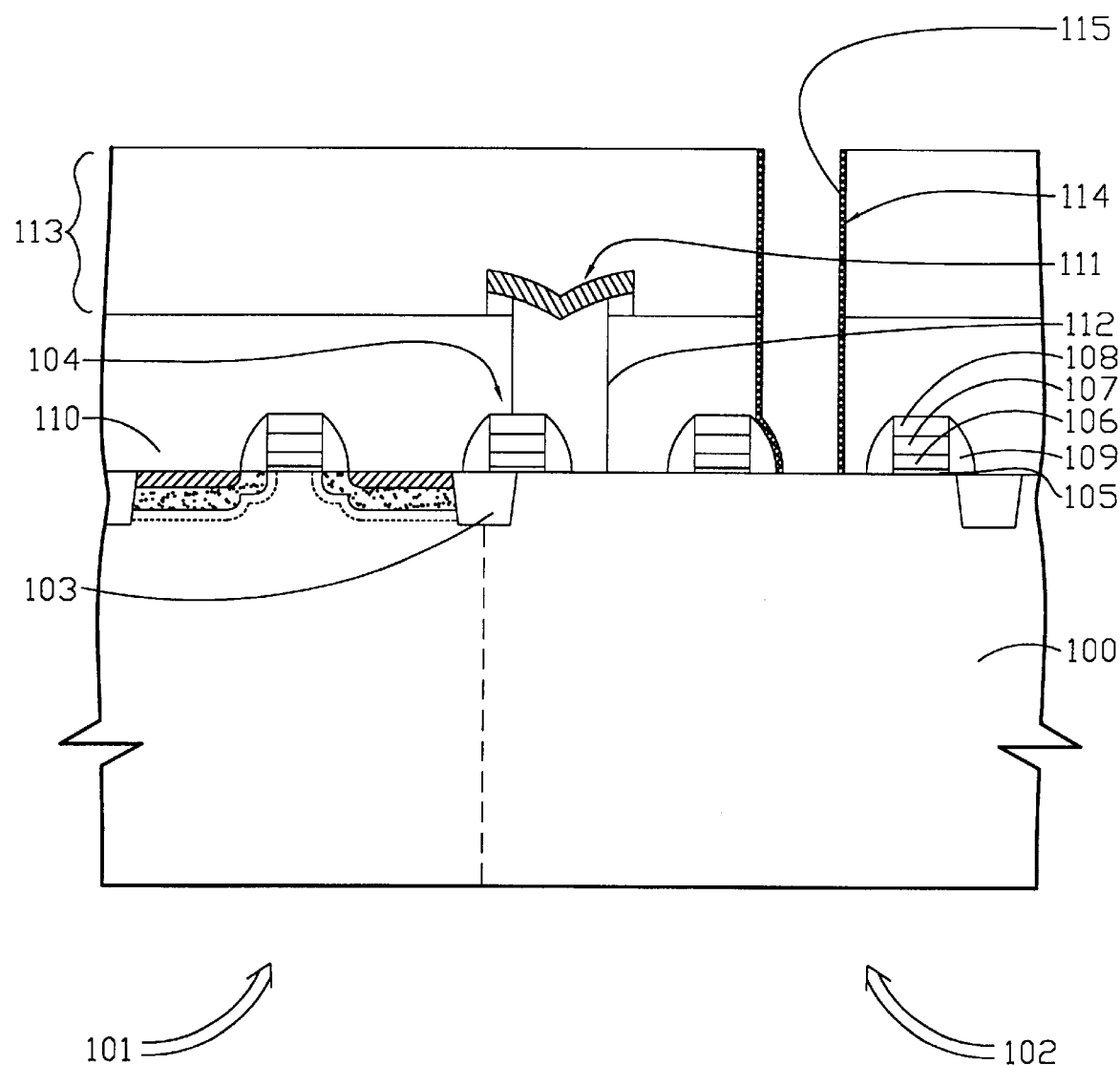
FIG. 2 shows the cross-section view of an E-DRAM until the IPD2 with a node contact opening, therein the re-diffusion problem in prior art is solved by the present invention.

In one embodiment of the present invention, a substrate 100, as shown in FIG. 2, is first provided. The substrate 100 has a logic region 101 and a memory region 102, and there is a shallow trench isolation (STI) 103 between the two regions for compartment. All the steps about the manufacture of well or other devices in the substrate 100 are omitted here.

A plurality of gates 104 that the two regions require are formed at the suitable location on the substrate 100. For each of the gates, we can form an gate oxide 105 on the substrate 100, then deposit a poly-silicon 106 on the gate oxide, a polycide 107 on the poly-silicon 106, and a silicon nitride (SiN) on the polycide to serve as a cap isolator 108. The couple of both the poly-silicon 106 and the polycide 107 serves as a gate electrode. If not for self-aligned contact process, the cap isolator 108 can be chosen oxide instead of the silicon nitride. Next, the photolithography and etch are used for defining the gate region and etching the layers. A silicon nitride layer 109 is then formed against side wall of the etched layers by deposition and etch back to serve as a spacer. After that, the gates 104 are completed.

A first inter-poly dielectric (IPD 1) layer 110, such as oxide, is deposited on all surfaces including of each gate 104 and the substrate 100. For the DRAM part (over the memory region 102 of the substrate 100), bit lines 111 are desired to be formed. We can utilize photolithography process first, which coats the first inter-poly dielectric layer 110 with photoresist, and then patterns the photoresist layer by exposure and development to form thereon a pattern of openings 112. Next, using the patterned photoresist as a mask, etch process is used to etch the first inter-poly dielectric layer 110 until top surface of the substrate 100 is exposed. After the openings 112 are completed, we should remove the photoresist layer by stripping. A conductor, such as poly-silicon or polyscide, is deposited on the IPD1 110 and to fill the openings 112. The conductor is directly conducted to the top surface of substrate 110. After the photolithography and etch processes are utilized for the conductor, the bit lines 111 are completed.

The following steps are used to form a second inter-poly dielectric (IPD2) layer 113 on both the first inter-poly dielectric layer 110 and the bit lines 111. We can use chemical vapor deposition (CVD) or other proper process to form an oxide on both the IPD1 110 and bit lines 111. We can also form a combination layer of oxide/nitride/oxide to serve as the second inter-poly dielectric layer 113.

After the IPD2 113 is completed, we coat the second inter-poly dielectric layer 113 with a photoresist layer, then pattern the photoresist layer with pattern of a node contact by exposure and development processes. The next step is etching the second inter-poly dielectric layer 113 and the first inter-poly dielectric layer 110, until top surface of the substrate 100 exposed, using the patterned photoresist layer as a mask. Then, we remove the photoresist layer. So that a node contact opening 114 for conduction between substrate and lower electrode of a capacitor is completed.

The rapid thermal chemical vapor deposition (RTCVD) process is used to deposit a silicon nitride (SiN) layer 115 on inside wall and bottom of the node contact opening 114. The silicon nitride layer 115 is used to be the buffer layer to ensure isolation between lower electrode of the capacitor and other improper devices such as the gate 104. The increasing rate of temperature of RTCVD is about 10 to 100° C. per second. The RTCVD is implemented for about 1–2 minutes under the condition of about 500 to 800° C. in temperature. The controlled temperature is about 50 to 200° C. lower than the conventional LPCVD. Thickness of the deposited silicon nitride 115 is about 300 to 400 angstroms. The lower implementing temperature and the shorter implementing time lead to preventing shift of threshold voltage and reducing thermal budget of the E-DRAM manufacture.

The later other steps for completing the E-DRAM, such as formation of lower and upper electrodes of the capacitor, can be done by the well-known conventional standard method. They are not important for the present invention, and we omit them in the description here.

Although specific embodiments have been illustrated and described, it will be obvious to those skilled in the art that various modifications may be made without departing from what is intended to be limited solely by the appended claims.

What is claimed is:

1. A method for forming a structure in an embedded dynamic random access memory, comprising:

providing a substrate having a logic region and a memory region;

forming gate structures on said logic region and said memory region;

forming a first inter-poly dielectric layer on surfaces of said gate structures and said substrate;

forming an opening, over said memory region, through said first inter-poly dielectric layer to top surface of said substrate;

forming a conductor on said first inter-poly dielectric layer and to fill said opening;

forming a bit line using photolithography and etching said conductor;

forming a second inter-poly dielectric layer on said first inter-poly dielectric layer and said bit line;

forming a node contact opening through said first inter-poly dielectric layer and said second inter-poly dielectric layer to top surface of said substrate; and forming a silicon nitride layer on inside wall of said node contact opening by rapid thermal chemical vapor deposition (RTCVD).

2. The method according to claim 1, wherein each of said gate structures comprises a gate oxide, a gate conductor over said gate oxide, a cap isolator over said gate conductor, and a spacer against said gate conductor.

3. The method according to claim 1, wherein said first inter-poly dielectric layer comprises oxide.

4. The method according to claim 1, wherein said conductor filling said opening comprises poly-silicon or polycide.

5. The method according to claim 1, wherein said second inter-poly dielectric layer comprises oxide.

6. The method according to claim 1, wherein said second inter-poly dielectric layer comprises silicon nitride.

7. The method according to claim 1, wherein said second inter-poly dielectric layer comprises a combination layer including a first oxide layer, a nitride layer, and a second oxide layer.

8. The method according to claim 1, wherein said node contact opening is formed by the following steps:

coating said second inter-poly dielectric layer with a photoresist layer;

patterning said photoresist layer by exposure and development;

etching said second inter-poly dielectric layer and said first inter-poly dielectric layer, until top surface of said substrate exposed, using said photoresist layer as a mask; and removing said photoresist layer.

9. The method according to claim 1, wherein the rapid thermal chemical vapor deposition is implemented for about 1 to 2 minutes.

10. The method according to claim 1, wherein the rapid thermal chemical vapor deposition is implemented under the condition of about 500 to 800° C. in temperature.

11. The method according to claim 1, wherein said silicon nitride layer has a thickness of about 300 to 400 angstroms.

* * * * *